United States Patent
Hill et al.

(10) Patent No.: US 11,621,187 B2
(45) Date of Patent: *Apr. 4, 2023

(54) SYSTEMS AND METHODS FOR CONTROLLING SUBSTRATE APPROACH TOWARD A TARGET HORIZONTAL PLANE

(71) Applicant: Lam Research Corporation, Fremont, CA (US)

(72) Inventors: Douglas Hill, Portland, OR (US); Cian Sweeney, Portland, OR (US); Manish Ranjan, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 470 days.

This patent is subject to a terminal disclaimer.

(21) Appl. No.: 16/819,004

(22) Filed: Mar. 13, 2020

(65) Prior Publication Data

US 2020/0219754 A1 Jul. 9, 2020

Related U.S. Application Data

(63) Continuation of application No. 15/462,765, filed on Mar. 17, 2017, now Pat. No. 10,593,586.

(51) Int. Cl.
| | |
|---|---|
| *H01L 21/687* | (2006.01) |
| *C25D 17/00* | (2006.01) |
| *C25D 21/12* | (2006.01) |
| *H01L 21/67* | (2006.01) |
| *C25D 17/06* | (2006.01) |

(52) U.S. Cl.
CPC ...... *H01L 21/68742* (2013.01); *C25D 17/001* (2013.01); *C25D 17/06* (2013.01); *C25D 21/12* (2013.01); *H01L 21/6723* (2013.01); *H01L 21/68764* (2013.01)

(58) Field of Classification Search
CPC ........ H01L 21/68742; H01L 21/68764; C25D 17/001; C25D 17/06; C25D 21/12
See application file for complete search history.

(56) References Cited

U.S. PATENT DOCUMENTS

| | | | |
|---|---|---|---|
| 10,593,586 B2* | 3/2020 | Hill | C25D 21/12 |
| 2012/0305387 A1* | 12/2012 | Minami | C25D 5/08 |
| | | | 204/232 |

* cited by examiner

*Primary Examiner* — Alexander W Keeling
(74) *Attorney, Agent, or Firm* — Penilla IP, APC

(57) ABSTRACT

A determination is made of a real-time azimuthal position of a notch alignment feature located on a support surface of a substrate holder relative to a fixed reference ray extending perpendicularly away from a rotational axis of the substrate holder as the substrate holder rotates about the rotational axis. A determination is made of an approach initiation azimuthal position of the notch alignment feature relative to the fixed reference ray at which vertical movement of the substrate holder should initiate in order to have the notch alignment feature located at a prescribed azimuthal position relative to the fixed reference ray when the substrate holder reaches a prescribed vertical position. A determination is made of a time delay required to have the notch alignment feature located at the approach initiation azimuthal position. Vertical movement of the substrate holder is initiated in accordance with the determined time delay.

20 Claims, 8 Drawing Sheets

View A-A

View A-A

SYSTEMS AND METHODS FOR CONTROLLING SUBSTRATE APPROACH TOWARD A TARGET HORIZONTAL PLANE

CLAIM OF PRIORITY

This application is a continuation application under 35 U.S.C. 120 of prior U.S. patent application Ser. No. 15/462,765, filed on Mar. 17, 2017, the disclosure of which is incorporated herein by reference in its entirety for all purposes.

BACKGROUND

1. Field of the Invention

The present invention relates to semiconductor device fabrication.

2. Description of the Related Art

Modern semiconductor device fabrication can include performing an electroplating process on a substrate to plate a layer of conductive material within structures present on the substrate. In the electroplating process, an electroplating cell, i.e., tool, is loaded with the substrate. The substrate is tilted and rotated prior to entry of the substrate into the electroplating solution to provide for bubble clearance and process improvement. A potentiostatic electroplating process in which a voltage is applied to the conductive seed layer on the substrate during entry of the substrate into the electroplating solution is typically used in newer technology nodes in order to prevent seed material dissolution and to maintain uniform electrical current density on the substrate during entry. In the potentiostatic electroplating process, plating occurs as soon as the conductive seed layer material contacts the electroplating solution. The plating results on the substrate as a function of position on the substrate can be correlated to how the substrate enters the electroplating solution. Therefore, it is of interest to know which point on the substrate first contacts the electroplating solution. It is within this context that the present invention arises.

SUMMARY

In an example embodiment, an electroplating system is disclosed. The electroplating system includes a substrate holder having a lower surface configured to contact a backside of a substrate. The substrate holder is configured to securely hold the substrate with a frontside of the substrate facing downward. The substrate holder has a notch alignment feature located at a periphery of the lower surface of the substrate holder. The substrate holder is configured to rotate about a rotational axis extending through a centerpoint of the lower surface of the substrate holder. The rotational axis is oriented normal to the lower surface of the substrate holder. The substrate holder is configured to tilt relative to a horizontal plane. The substrate holder is configured to move vertically relative to a bath of electroplating solution to be located below the substrate holder. The electroplating system includes a tilt mechanism connected to the substrate holder to provide angular position control of the lower surface of the substrate holder relative to the horizontal plane. The electroplating system includes a lift mechanism connected to the substrate holder to provide vertical position control of the substrate holder. The electroplating system includes a rotation mechanism connected to the substrate holder to provide rotational control of the substrate holder about the rotational axis. The electroplating system includes a controller configured to provide integrated control of the lift mechanism and the rotation mechanism to enable control of an azimuthal position of the notch alignment feature about the rotational axis relative to a fixed reference ray extending perpendicularly away from the rotational axis when the substrate holder reaches a prescribed vertical position at which the substrate held on the substrate holder first contacts the bath of electroplating solution.

In an example embodiment, a system for controlling substrate approach toward a target horizontal plane is disclosed. The system includes a notch alignment feature location module configured to determine a real-time azimuthal position of a notch alignment feature located at a periphery of a lower surface of a substrate holder as the substrate holder rotates about a rotational axis oriented normal to the lower surface of the substrate holder. The real-time azimuthal position of the notch alignment feature is determined relative to a fixed reference ray extending perpendicularly away from the rotational axis. The system also includes an approach initiation control module configured to determine an approach initiation azimuthal position of the notch alignment feature relative to the fixed reference ray at which vertical movement of the substrate holder should initiate in order to have the notch alignment feature located at a prescribed azimuthal position relative to the fixed reference ray when the substrate holder reaches a prescribed vertical position. The approach initiation control module is further configured to determine a time delay required to have the notch alignment feature located at the approach initiation azimuthal position based on the determined real-time azimuthal position of the notch alignment feature and on a real-time rotational status of the substrate holder. The approach initiation control module is further configured to initiate vertical movement of the substrate holder in accordance with the determined time delay.

In an example embodiment, a method is disclosed for controlling an approach of a substrate toward a target horizontal plane. The method includes positioning a substrate on a support surface of a substrate holder configured to securely hold the substrate. The substrate holder has a notch alignment feature located at a periphery of the support surface of the substrate holder. The substrate holder is configured to rotate about a rotational axis extending through a centerpoint of the support surface of the substrate holder. The rotational axis is oriented normal to the support surface of the substrate holder. The substrate holder is configured to tilt relative to the target horizontal plane. The substrate holder is configured to move vertically relative to the target horizontal plane. The method also includes tilting the substrate holder to a prescribed angular position of the support surface relative to the target horizontal plane. The method also includes rotating the substrate holder about the rotational axis at a prescribed rotational speed. The method also includes determining a real-time azimuthal position of the notch alignment feature as the substrate holder rotates about the rotational axis. The real-time azimuthal position of the notch alignment feature is determined relative to a fixed reference ray extending perpendicularly away from the rotational axis. The method also includes determining an approach initiation azimuthal position of the notch alignment feature relative to the fixed reference ray at which vertical movement of the substrate holder should initiate in order to have the notch alignment feature located at a prescribed azimuthal position relative to the fixed reference ray when the substrate holder reaches a prescribed vertical position relative to the target horizontal plane. The method also includes determining a time delay required to have the notch alignment feature located at the approach initiation azimuthal position based on the determined real-time azimuthal position of the notch alignment feature and on the prescribed rotational speed. The method also includes initiating vertical movement of the substrate holder toward the target horizontal plane in accordance with the determined time delay.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
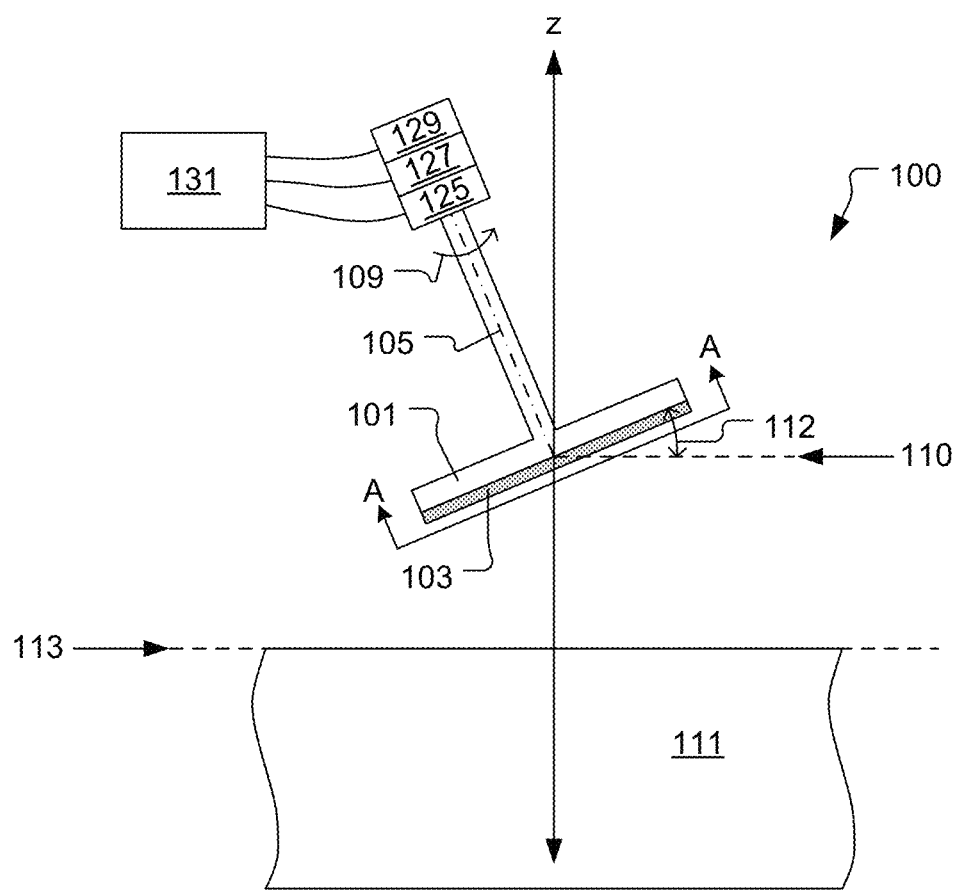
FIG. 1A shows an example diagram of an electroplating system, in accordance with some embodiments of the present invention.
Figure 1B:
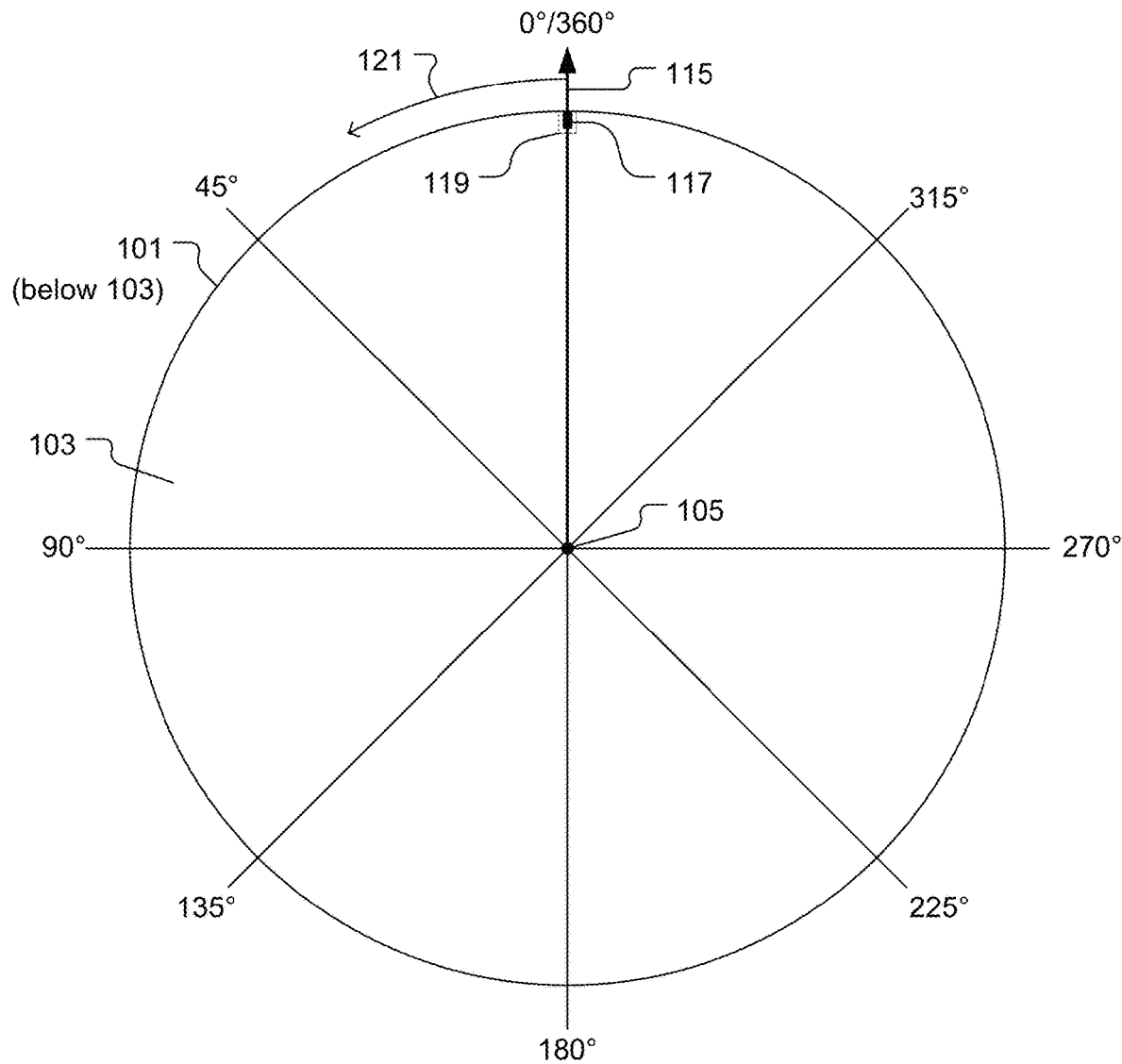
FIG. 1B shows a View A-A as referenced in FIG. 1A looking toward an underside of the substrate held by the substrate holder, in accordance with some embodiments of the present invention.

FIG. 1A shows an example diagram of an electroplating system 100, in accordance with some embodiments of the present invention. The electroplating system 100 includes a substrate holder 101 having a lower surface configured to contact a backside of a substrate 103. The substrate holder 101 is configured to securely hold the substrate 103 with a frontside of the substrate 103 facing downward. FIG. 1B shows a View A-A as referenced in FIG. 1A looking toward an underside of the substrate 103 held by the substrate holder 101, in accordance with some embodiments of the present invention. As shown in FIG. 1B, the substrate holder 101 has a notch alignment feature 117 located at a periphery of the lower surface of the substrate holder 101. The substrate 103 has a notch 119 that the notch alignment feature 117 aligns to when the substrate 103 is positioned on the substrate holder 101.

In some embodiments, the substrate 103 is a semiconductor wafer undergoing a fabrication procedure. However, it should be understood that in various embodiments, the substrate 103 can be essentially any type of substrate that is subjected to an electroplating process. For example, in some embodiments, the term substrate 103 as used herein can refer to substrates formed of sapphire, GaN, GaAs or SiC, or other substrate materials, and can include glass panels/substrates, metal foils, metal sheets, polymer materials, or the like. Also, in various embodiments, the substrate 103 as referred to herein may vary in form, shape, and/or size. For example, in some embodiments, the substrate 103 referred to herein may correspond to a 200 mm (millimeters) semiconductor wafer, a 300 mm semiconductor wafer, or a 450 mm semiconductor wafer. Also, in some embodiments, the substrate 103 referred to herein may correspond to a non-circular substrate, such as a rectangular substrate for a flat panel display, or the like, among other shapes.

As shown in FIGS. 1A and 1B, the substrate holder 101 is configured to rotate about a rotational axis 105 extending through a centerpoint of the lower surface of the substrate holder 101, as indicated by the rotational arrow 109. It should be understood that in various electroplating process embodiments the substrate holder 101 can be rotated in either a clockwise manner about the rotational axis 105, or a counter-clockwise manner about the rotational axis 105, or in both the clockwise manner and counter-clockwise manner about the rotational axis 105. Therefore, it should be understood that the direction of the rotational arrow 109 is provided by way of example. The rotational axis 105 is oriented normal to the lower surface of the substrate holder 101. The substrate holder 101 is also configured to tilt relative to a horizontal reference plane 110, such that the lower surface of the substrate holder 101 is oriented at a prescribed angular position 112 relative to the horizontal reference plane 110. The substrate holder 101 is configured to move vertically (in the z-direction) relative to a bath of an electroplating solution 111 to be located below the substrate holder 101.

Figure 1C:
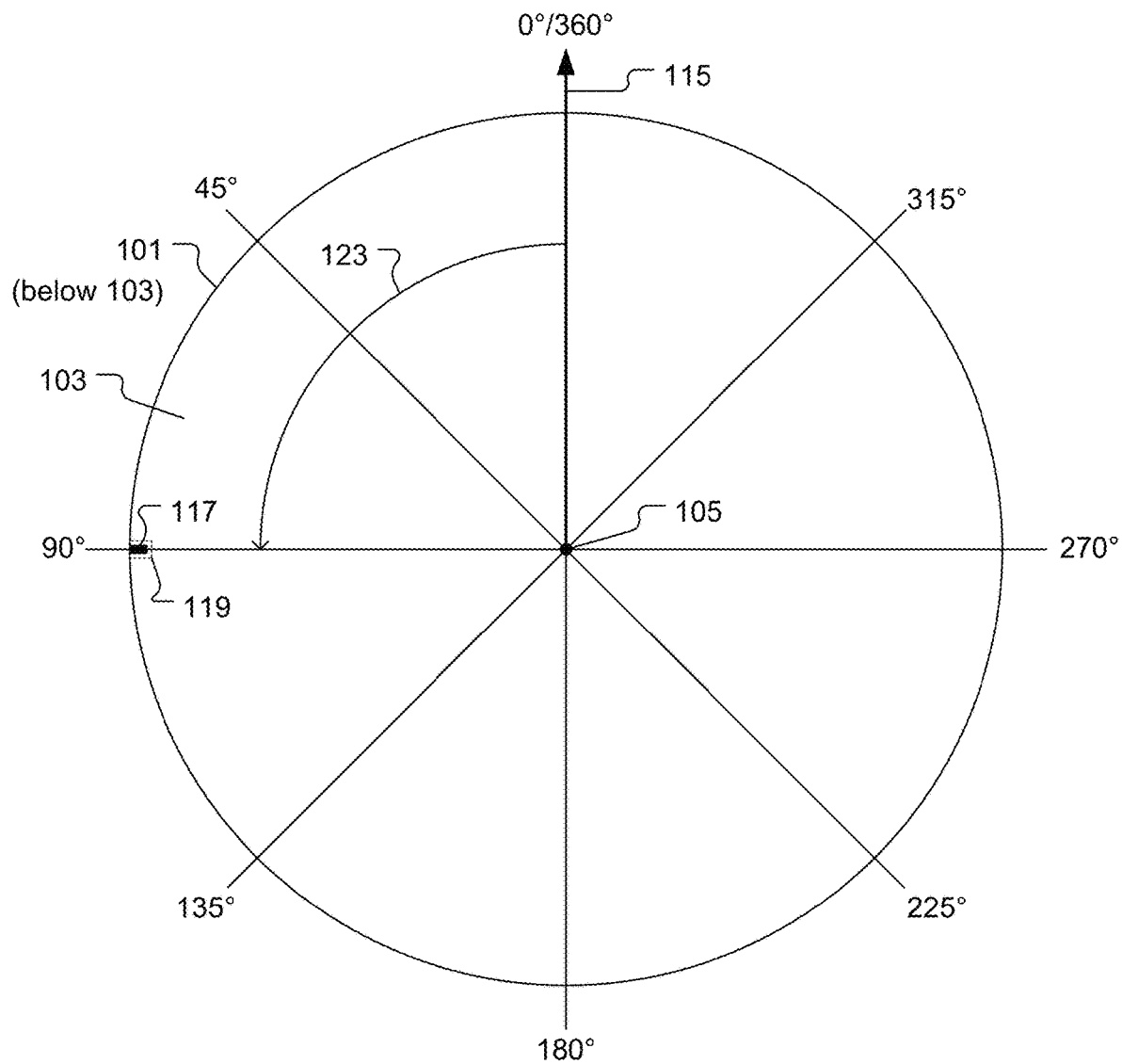
FIG. 1C shows the View A-A of FIG. 1B with the substrate holder rotated about the rotational axis such that the notch alignment feature is located at an azimuthal position of 90° relative to the fixed reference ray, in accordance with some embodiments of the present invention.

The electroplating system 100 also includes a tilt mechanism 127 connected to the substrate holder 101 to provide angular position control of the lower surface of the substrate holder 101 relative to the horizontal reference plane 110. The electroplating system 100 also includes a lift mechanism 129 connected to the substrate holder 101 to provide vertical position control (in the z-direction) of the substrate holder 101. The electroplating system 100 also includes a rotation mechanism 125 connected to the substrate holder 101 to provide rotational control of the substrate holder 101 about the rotational axis 105. The electroplating system 100 also includes a controller 131 to provide control of the tilt mechanism 127, the lift mechanism 129, and the rotation mechanism 125. More specifically, the controller 131 is configured to provide real-time integrated control of the lift mechanism 129 and the rotation mechanism 125 to enable control of an azimuthal position 121 (see FIG. 1B) of the notch alignment feature 117 about the rotational axis 105 relative to a fixed reference ray 115 extending perpendicularly away from the rotational axis 105 when the substrate holder 101 reaches a prescribed vertical position (in the z-direction) relative to a target horizontal plane 113. It should be understood that the fixed reference ray 115 is located within a plane coincident with the lower surface of the substrate holder 101. For example, FIG. 1C shows the View A-A of FIG. 1B with the substrate holder 101 rotated about the rotational axis 105 such that the notch alignment feature 117 is located at an azimuthal position 123 of 90° relative to the fixed reference ray 115. In some embodiments, the prescribed vertical position of the substrate holder 101 relative to the target horizontal plane 113 corresponds to a vertical position of the substrate holder 101 at which the substrate 103 held on the substrate holder 101 first contacts the bath of the electroplating solution 111. Therefore, in these embodiments, the controller 131 is configured to provide real-time integrated control of the lift mechanism 129 and the rotation mechanism 125 to enable control of the azimuthal position 121 (see FIG. 1B) of the notch alignment feature 117 about the rotational axis 105 relative to the fixed reference ray 115 when the substrate 103, as held on the substrate holder 101, first contacts the bath of the electroplating solution 111 as the substrate holder 101 is moved downward in the vertical (z) direction.

Because plating starts as soon as the substrate 101 touches the electroplating solution 111, knowing and controlling the location on the substrate 101 that first contacts the electroplating solution 111 is important for process stability and defect troubleshooting purposes. Systems and methods are disclosed herein for accurately monitoring and controlling the location on the substrate 101 that first contacts the electroplating solution 111. The accurate monitoring and controlling of the location on the substrate 101 that first contacts the electroplating solution 111 can be referred to as Advanced Notch Control (ANC).

Prior to entry of the substrate 103 into the electroplating solution 111, there are a number of mechanical and hardware verification steps performed by the controller 131, such as verification of proper loading of the substrate 103 on the substrate holder 101, substrate holder 101 rotation velocity verification, substrate holder 101 tilt angle verification, electroplating solution 111 flow rate verification, electroplating solution 111 temperature verification, power supply communication and readiness verification, among others. There are inherent hardware and software communication delays in executing these various mechanical and hardware verification steps. Also, because many of these verification steps are performed after the substrate holder 101 has started rotating to provide for throughput improvement, variability in the location on the substrate 103 that first contacts the electroplating solution 111 is seen from substrate-to-substrate, which causes process stability issues and impacts overall device yield.

In newer technology nodes with smaller and smaller feature sizes, the electroplating process can fill an entire feature within a few seconds. Also, most of the voids and catastrophic device defects happen during the initial stages of the electroplating process. For example, plating defects, such as voids and/or seed layer dissolution, among others, can occur at the initiation of the electroplating process, e.g., within the first second of the electroplating process. Also, the flow dynamics of the electroplating solution 111 on the surface of the substrate 103 can be dependent upon the location on the substrate 103 that first contacts the electroplating solution 111. Therefore, it is necessary to know the specific location on the substrate 103 that first contacts the electroplating solution 111 to facilitate troubleshooting.

Conventional electroplating systems do not provide for control or monitoring of the specific location on the substrate 103 that first contacts the electroplating solution 111. A prior "burn-in" approach to identifying the specific location on the substrate 103 that first contacts the electroplating solution 111 was to apply a high voltage (>2 V) to a blank Cu seed wafer when the blank Cu seed wafer is moved to initially contact the electroplating solution 111, causing generation of a "burn mark" (or "haze mark") on the blank Cu seed wafer indicative of which location on the blank Cu seed wafer first contacted the electroplating solution 111. After the electroplating process, the blank Cu seed wafer can be measured on a haze map metrology tool to identify the location that first contacted the electroplating solution 111. Then, the same substrate 103 loading and movement program as used for the blank Cu seed wafer would be used for electroplating another patterned wafer with the assumption that the initial plating contact location determined for the blank Cu seed wafer would be applicable to the patterned wafer.

However, the defect performance on the substrate 103 is dependent on the overall entry profile of the substrate 103 into the electroplating solution 111, with the location of first contact with the electroplating solution 111 being one of many parameters in the overall entry profile. For example, the entry profile can also include parameters such as substrate 103 tilt angle, substrate 103 rotation acceleration/deceleration/velocity, substrate 103 vertical acceleration/deceleration/velocity, electroplating solution 111 fill level, electroplating solution 111 composition, electroplating solution 111 flow rate, electroplating solution 111 temperature, among others. Therefore, the prior "burn-in" approach is not reliable enough to support defect troubleshooting analysis. Also, the prior "burn-in" approach causes additional electroplating tool down time and requires extra resources and increases costs.

Information on the location on the substrate that first contacts the electroplating solution 111 is needed to find the root cause of defects, such as voids, and to determine the electroplating step when the defect was formed. It should be appreciated that the substrate-to-substrate variability with regard to the location on the substrate that first contacts the electroplating solution 111 makes its very difficult, if not impossible, to correlate defects that have a low hit rate (occur infrequently) with the location on the substrate that first contacts the electroplating solution 111 during defect troubleshooting. Therefore, the defect troubleshooting process becomes less reliable when there is variability in the location on the substrate that first contacts the electroplating solution 111 from one substrate to another substrate. Also, with regard to the "burn-in" approach, it should be appreciated that the location on the blank Cu seed wafer that first contacts the electroplating solution 111 may not be the same location that first contacts the electroplating solution 111 on the patterned substrate where the defect signature exists, which can complicate the defect troubleshooting process.

Figure 2A:
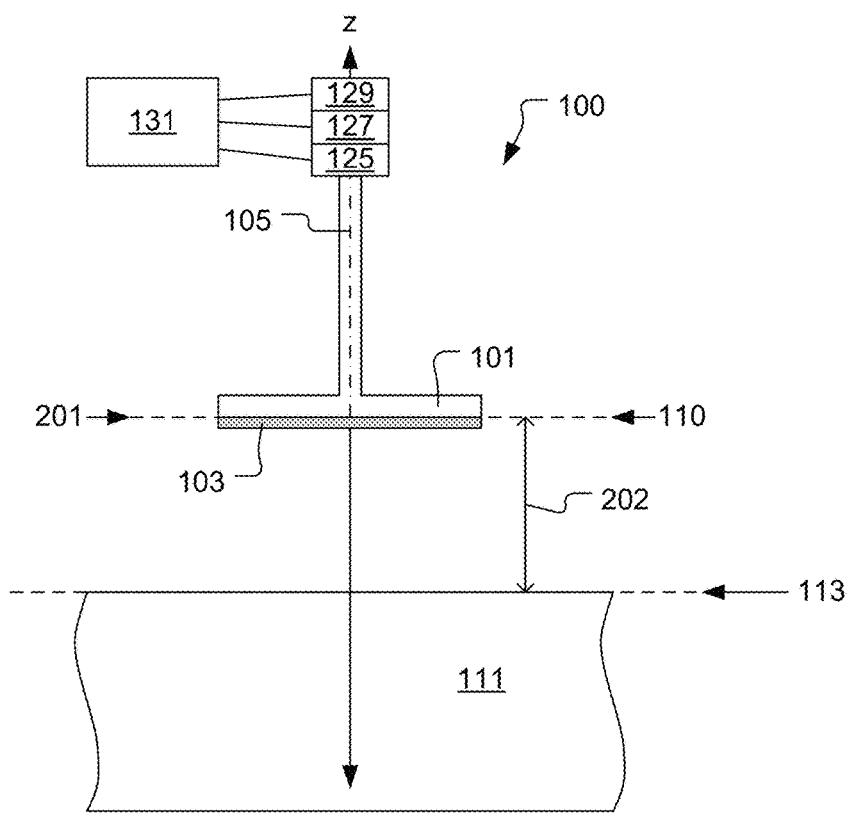
FIG. 2A shows the substrate holder of FIGS. 1A-1C positioned at a substrate loading position as referenced to the z-direction, in accordance with some embodiments of the present invention.

FIGS. 2A-2D show a series of diagrams illustrating movement of the substrate holder 101 in an electroplating process, in accordance with some embodiments of the present invention. FIG. 2A shows the substrate holder 101 of FIGS. 1A-1C positioned at a substrate loading position 201 as referenced to the z-direction, in accordance with some embodiments of the present invention. At the substrate loading position 201, the substrate 103 is positioned on and secured to the substrate holder 101. It should be understood that in some embodiments loading of the substrate 103 on the substrate holder 101 can be performed using any suitable robotic/electromechanical device(s) available within the semiconductor fabrication industry. The substrate loading position 201 is located at a distance 202 above the target horizontal plane 113, where the target horizontal plane 113 is this example corresponds to a top surface of the bath of the electroplating solution 111. It should be understood that in other embodiments, the target horizontal plane 113 can be established as essentially any horizontal plane normal to the z-direction that provides a suitable reference against which vertical movement control of the substrate holder 101 can be specified. In some embodiments, the target horizontal plane 113 can be located above the top surface of the bath of the electroplating solution 111. And, in some embodiments, the target horizontal plane 113 can be located below the top surface of the bath of the electroplating solution 111. And, in some embodiments, the target horizontal plane 113 can be located substantially coincident with the top surface of the bath of the electroplating solution 111.

Figure 2B:
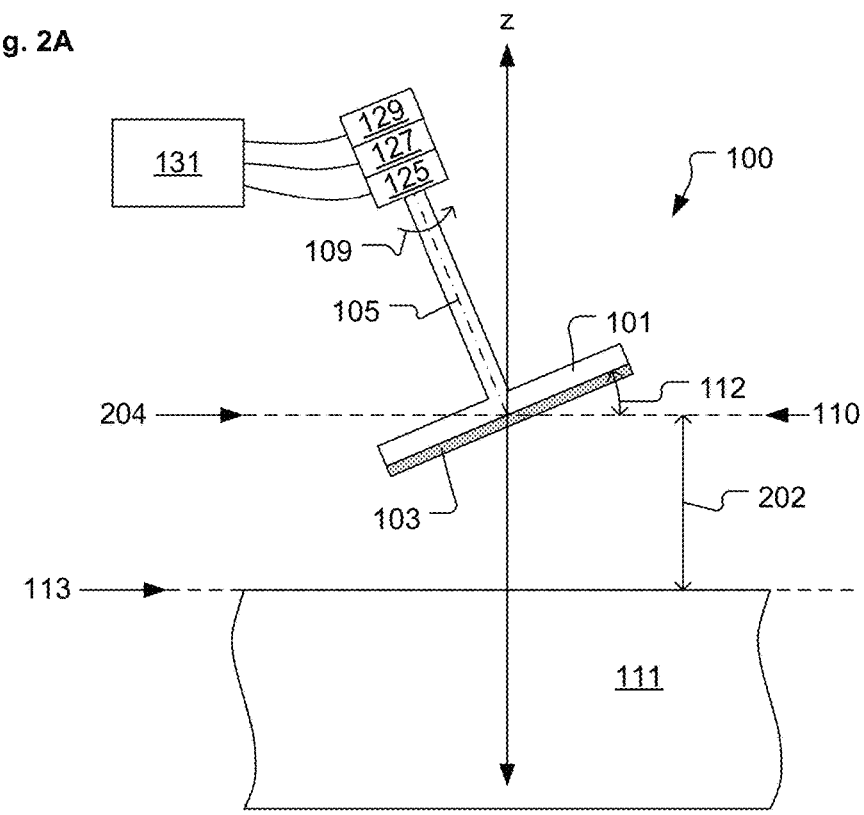
FIG. 2B shows the substrate holder of FIGS. 1A-1C positioned at the substrate loading position as referenced to the z-direction, with an entry commencement state having been applied to the substrate holder, in accordance with some embodiments of the present invention.

FIG. 2B shows the substrate holder 101 of FIGS. 1A-1C positioned at a substrate entry start position 204 as referenced to the z-direction, with an entry commencement state having been applied to the substrate holder 101, in accordance with some embodiments of the present invention. The entry commencement state includes tilting of the substrate holder 101 such that the lower surface of the substrate holder 101 is oriented at the prescribed angular position 112 relative to the horizontal reference plane 110. The entry commencement state also includes the substrate holder 101 rotating about the rotational axis 105 at a prescribed rotational velocity as indicated by the rotational arrow 109. It should be understood that at the substrate holder 101 moves vertically from the substrate entry start position 204 toward the target horizontal plane 113, the notch alignment feature 117 on the lower surface of the substrate holder 101 will be traveling in a circular path about the rotational axis 105 within a plane oriented at the prescribed angular position 112 relative to the horizontal reference plane 110.

Figure 2C:
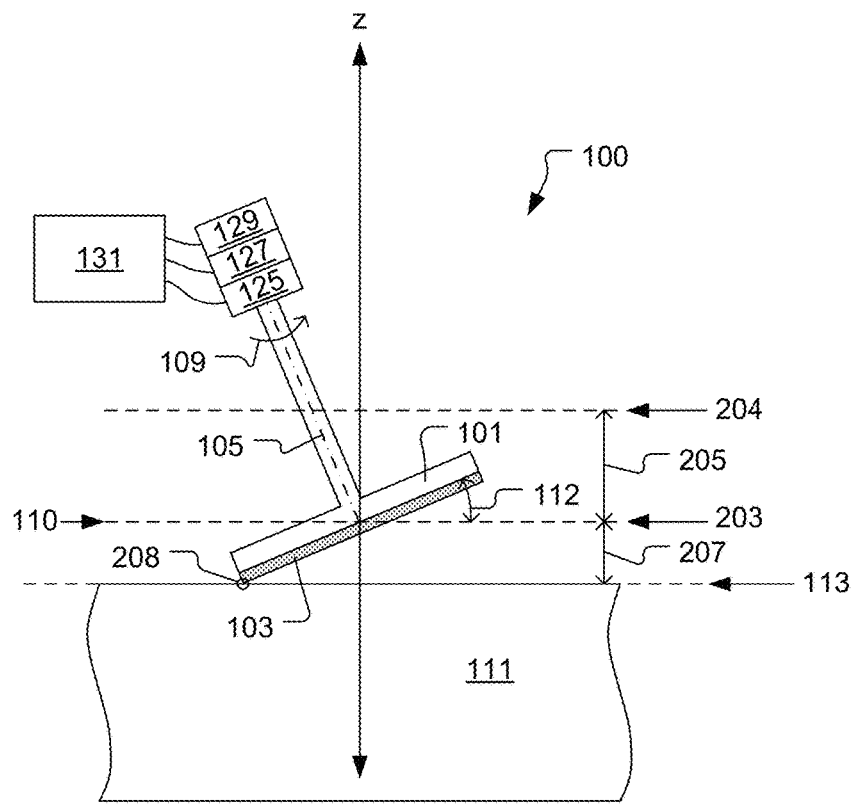
FIG. 2C shows the substrate holder of FIGS. 1A-1C having been moved vertically through a distance from the substrate loading position to a prescribed vertical position relative to the target horizontal plane, in accordance with some embodiments of the present invention.

FIG. 2C shows the substrate holder 101 of FIGS. 1A-1C having been moved vertically through a distance 205 from the substrate entry start position 204 to a prescribed vertical position 203 relative to the target horizontal plane 113, in accordance with some embodiments of the present invention. In some embodiments, the prescribed vertical position 203 can be specified by the distance 205 as measured vertically (in the z-direction) between the substrate entry start position 204 and the prescribed vertical position 203. And, in some embodiments, the prescribed vertical position 203 can be specified by a distance 207 as measured vertically (in the z-direction) between the prescribed vertical position 203 and the target horizontal plane 113. In some embodiments, the prescribed vertical position 203 is specified to correspond to the vertical position of the substrate holder 101 at which the substrate 103 first contacts the bath of the electroplating solution 111, as indicated by location 208. In these embodiments, the prescribed vertical position 203 can be referred to as the liquid touch point (LTP).

Figure 2D:
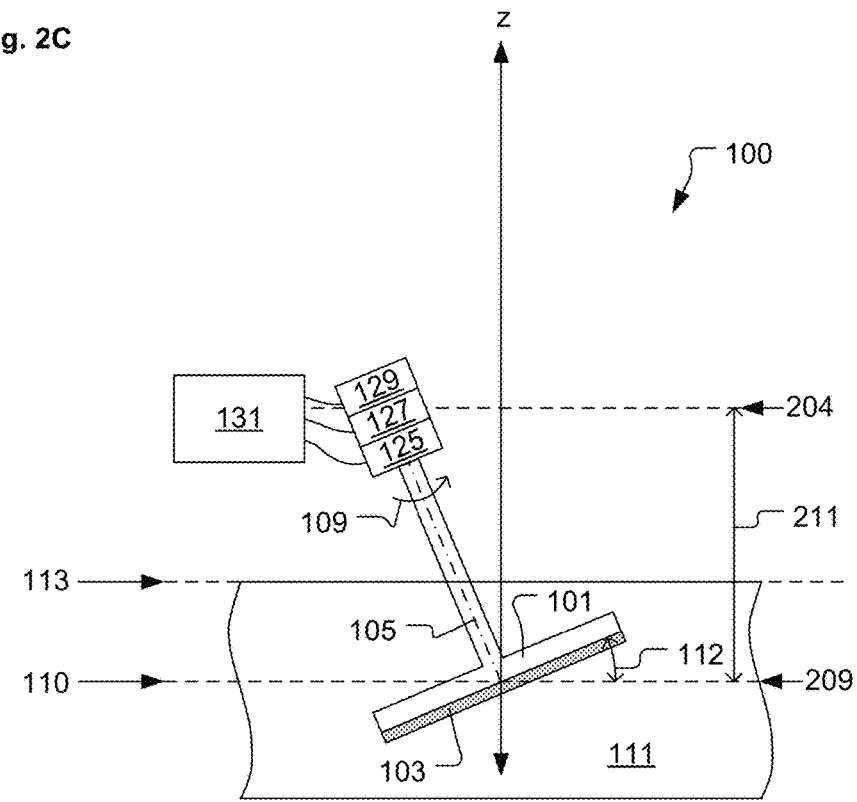
FIG. 2D shows the substrate holder of FIGS. 1A-1C having been moved vertically through a distance from the substrate loading position to a target processing vertical position, in accordance with some embodiments of the present invention.

FIG. 2D shows the substrate holder 101 of FIGS. 1A-1C having been moved vertically through a distance 211 from the substrate entry start position 204 to a target processing vertical position 209, in accordance with some embodiments of the present invention. In some embodiments, such as the example shown in FIG. 2D, the target processing vertical position 209 corresponds to a vertical position of the substrate holder 101 at which the substrate 103 is fully immersed in the bath of the electroplating solution 111. However, in some embodiments, the target processing vertical position 209 corresponds to a vertical position of the substrate holder 101 at which the substrate 103 is partially immersed in the bath of the electroplating solution 111. And, in some embodiments, the target processing vertical position 209 corresponds to a vertical position of the substrate holder 101 at which the substrate 103 is at least half immersed in the bath of the electroplating solution 111.

Some prior electroplating tools use two independent master motion controllers for controlling the vertical movement of the substrate holder 101 and the rotation of the substrate holder 101, respectively, with each of the two independent master motion controllers communicating through software for coordination of vertical movement and rotation actions. It should be understood that in these prior electroplating tools, the two independent master motion controllers for controlling the vertical movement of the substrate holder 101 and the rotation of the substrate holder 101 do not have the capability to communicate directly with each other through non-software means, e.g., through circuitry (hardware) and/or firmware. Due to normal signal communication delays associated with execution of the control software, it is not feasible to have very high precision in the timing of coordinated vertical and rotational movements of substrate holder 101 with two independent master motion controllers communicating with each other through software for coordination of vertical movement and rotation actions.

Very high precision in the timing of communication between the substrate holder vertical movement and rotation controllers is required to track the notch alignment feature 117 position relative to the fixed reference ray 115 as the substrate rotates 101, and to initiate the vertical movement of the substrate holder 101 toward the bath of the electroplating solution 111 at the precise moment with the notch alignment feature 117 is correctly positioned relative to the fixed reference ray 115. It should be appreciated that due to the rapid vertical movement of the substrate holder 101 during its approach to the electroplating solution 111, simply coordinating the substrate holder 101 vertical movement and rotation command within software is not sufficient for accurate positioning of the notch alignment feature 117 relative to the fixed reference ray 115 at the precise moment when the substrate 103 first contacts the electroplating solution 111. For example, with the substrate holder 101 rotating about the rotational axis 105 at 90 revolutions per minute (RPM), a 10 millisecond variation in execution of a substrate holder 101 vertical movement and/or rotation command could result in an azimuthal variation in the position of the notch alignment feature 117 relative to the fixed reference ray 115 of over 5 degrees at the precise moment when the substrate 103 first contacts the electroplating solution 111. Moreover, changes in the electroplating system 100 setup, such as the substrate entry start position 204 relative to the bath of the electroplating solution 111 and/or the substrate holder 101 configuration, among others, can affect the repeatability in controlling the position of the notch alignment feature 117 relative to the fixed reference ray 115 at the precise moment when the substrate 103 first contacts the electroplating solution 111.

The controller 131 disclosed herein merges the control of the vertical movement and rotational movement of the substrate holder 101 into a single master controller through hardware and/or firmware to enable very high precision in the timing of coordinated vertical and rotational movements of substrate holder 101. It should be understood that with the control of the vertical movement and rotational movement of the substrate holder 101 implemented in hardware and/or firmware in the single master controller 131, the delay in execution of a substrate holder 101 vertical movement and/or rotation command is reduced to less than a microsecond. Also, operation of the single master controller 131 is programmable through software to enable precisely timed execution of substrate holder 101 vertical movement and/or rotation commands in accordance with a prescribed recipe to provide for control of the position of the notch alignment feature 117 relative to the fixed reference ray 115 at the precise moment when the substrate 103 first contacts the electroplating solution 111.

As previously mentioned, the controller 131 is configured to provide real-time integrated control of the lift mechanism 129 and the rotation mechanism 125 to enable control of the azimuthal position of the notch alignment feature 117 about the rotational axis 105 relative to the fixed reference ray 115 when the substrate holder 101 reaches the prescribed vertical position 203 relative to the target horizontal plane 113. Therefore, it should be understood that the controller 131 is configured to provide real-time integrated control of the lift mechanism 129 and the rotation mechanism 125 to control an azimuthal distance as measured about the rotational axis 105 between the notch alignment feature 117 and the location on the substrate 103 that first contacts the bath of the electroplating solution 111.

Figure 3:
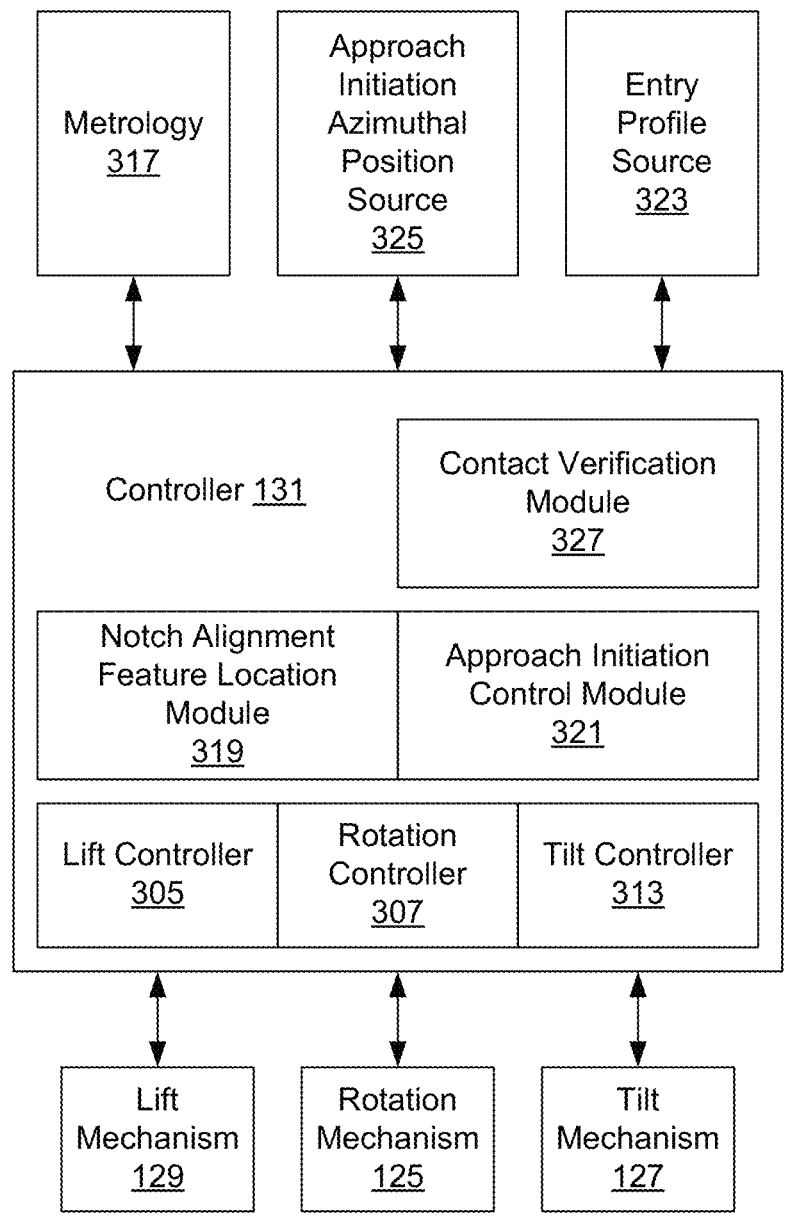
FIG. 3 shows an example architecture of the controller, in accordance with some embodiments of the present invention.

FIG. 3 shows an example architecture of the controller 131, in accordance with some embodiments of the present invention. The controller 131 includes a lift controller 305 configured to control the lift mechanism 129, and a rotation controller 307 configured to control the rotation mechanism 125, and a tilt controller configured to control the tilt mechanism 127. The controller 131 is also connected to receive data/information/signals from various electroplating cell metrology 317 deployed with the electroplating system 100. For example, in some embodiments, the various electroplating cell metrology 317 can include one or more sensors for detecting and verifying vertical positions of the substrate holder 101 and the top surface of the bath of the electroplating solution 111. Also, in some embodiments, the various electroplating cell metrology 317 can include one or more sensors for detecting and verifying a rotational status and/or tilt status of the substrate holder 101. Also, in some embodiments, the various electroplating cell metrology 317 can include one or more sensors for detecting and verifying one or more condition(s) of the bath of the electroplating solution 111, such a flow rate, temperature, composition, among others.

The controller 131 includes a notch alignment feature location module 319 configured to determine a real-time azimuthal position of the notch alignment feature 117 relative to the fixed reference ray 115 as the substrate holder 101 rotates about the rotational axis 105. It should be understood that the notch alignment feature location module 319 is configured to track and determine the real-time azimuthal position of the notch alignment feature 117 relative to the fixed reference ray 115 as the substrate holder 101 rotates about the rotational axis 105 when the substrate holder 101 is positioned at the substrate entry start position 204 and prior to initiating vertical movement of the substrate holder 101 toward the prescribed vertical position 203. Also, it should be understood that the notch alignment feature location module 319 is configured to track and determine the real-time azimuthal position of the notch alignment feature 117 relative to the fixed reference ray 115 as the substrate holder 101 rotates about the rotational axis 105 as the substrate holder 101 is moved vertically from the substrate entry start position 204 to the prescribed vertical position 203.

In some embodiments, the notch alignment feature location module 319 is implemented within the controller 131 as a combination of hardware and firmware. It should be understood that implementation of the notch alignment feature location module 319 as a combination of hardware and firmware mitigates data communication delays that would otherwise be incurred if the notch alignment feature location module 319 were implemented in software. Therefore, with the notch alignment feature location module 319 being implemented as a combination of hardware and firmware it is possible for the notch alignment feature location module 319 to perform its function of determining the real-time azimuthal position of the notch alignment feature 117 relative to the fixed reference ray 115 as the substrate holder 101 rotates about the rotational axis 105.

The controller 131 also includes an approach initiation control module 321 configured to determine an approach initiation azimuthal position of the notch alignment feature 117 relative to the fixed reference ray 115 at which downward movement of the substrate holder 101 should initiate in order to have the notch alignment feature 117 located at a prescribed azimuthal position relative to the fixed reference ray 115 when the substrate holder 101 reaches the prescribed vertical position 203. It should be understood that the approach initiation azimuthal position of the notch alignment feature 117 relative to the fixed reference ray 115 is an azimuthal distance as measured in degrees about the rotational axis 105 between the fixed reference ray 115 and the notch alignment feature 117 present on the lower surface of the substrate holder 101 when the substrate holder 101 begins its vertical movement (in the z-direction) from the substrate entry start position 204 toward the prescribed vertical position 203. And, it should be understood that the approach initiation azimuthal position of the notch alignment feature 117 relative to the fixed reference ray 115 is determined such that the azimuthal distance as measured about the rotational axis 105 between the notch alignment feature 117 and the location on the substrate 103 that first contacts the bath of the electroplating solution 111 will be equal to a prescribed azimuthal distance when the substrate holder 101 reaches the prescribed vertical position 203.

In some embodiments, the approach initiation control module 321 is implemented within the controller 131 as a combination of hardware and firmware. It should be understood that implementation of the approach initiation control module 321 as a combination of hardware and firmware mitigates data communication delays that would otherwise be incurred if the approach initiation control module 321 were implemented in software. Therefore, with the approach initiation control module 321 being implemented as a combination of hardware and firmware it is possible for the approach initiation control module 321 to perform its function of determining the approach initiation azimuthal position of the notch alignment feature 117 relative to the fixed reference ray 115 at which downward movement of the substrate holder 101 should initiate in order to have the notch alignment feature 117 located at the prescribed azimuthal position relative to the fixed reference ray 115 when the substrate holder 101 reaches the prescribed vertical position 203.

In some embodiments, the approach initiation control module 321 is configured to process an entry profile to determine the approach initiation azimuthal position of the notch alignment feature 117 relative to the fixed reference ray 115. The entry profile includes a rotational movement specification for the substrate holder 101 and a vertical movement specification for the substrate holder 101 to be implemented from initiation of vertical movement of the substrate holder 101 at the substrate entry start position 204 until the substrate holder 101 reaches the prescribed vertical position 203. In some embodiments, an electroplating recipe can specify use of a certain entry profile for optimization of the electroplating process, e.g., to minimize air entrapment. The rotational movement specification includes information (such as rotational acceleration, rotational deceleration, and/or rotational velocity, all as a function of time) indicating how the substrate holder 101 is to be rotated about the rotational axis 105 during the time period from initiation of downward movement of the substrate holder 101 at the substrate entry start position 204 until the substrate holder 101 reaches the prescribed vertical position 203. The vertical movement specification includes information (such as vertical acceleration, vertical deceleration, and/or vertical velocity, all as a function of time) indicating how the substrate holder 101 is to be moved vertically (in the z-direction either up, down, and/or a combination of up and down) during the time period from initiation of downward movement of the substrate holder 101 at the substrate entry start position 204 until the substrate holder 101 reaches the prescribed vertical position 203. In some embodiments, the controller 131 is configured to obtain the entry profile from an external source 323, such as a database or the like.

In some embodiments, the approach initiation control module 321 is configured to compute the approach initiation azimuthal position of the notch alignment feature 117 relative to the fixed reference ray 115 based on the entry profile. And, in some embodiments, the approach initiation control module 321 is configured to obtain the approach initiation azimuthal position of the notch alignment feature 117 relative to the fixed reference ray 115 from an external source 325, such as a database or the like, in which is stored a number of pre-determined, i.e., pre-computed, approach initiation azimuthal positions of the notch alignment feature 117 relative to the fixed reference ray 115 for different entry profiles.

The approach initiation control module 321 is also configured to determine a time delay required to have the notch alignment feature 117 located at the approach initiation azimuthal position relative to the fixed reference ray 115 based on the determined real-time azimuthal position of the notch alignment feature 117 and on a real-time rotational status of the substrate holder 101. The real-time rotational status of the substrate holder 101 includes information necessary to characterize how the substrate holder 101 is rotating about the rotational axis 105 in real-time, such as information on real-time rotational velocity of the substrate holder 101, real-time rotational acceleration of the substrate holder 101, and/or real-time rotational deceleration of the substrate holder 101. The controller 131 is configured to direct the lift mechanism 129, by way of a lift controller 305, to initiate vertical movement of the substrate holder 101 from the substrate entry start position 204 to the prescribed vertical position 203 in accordance with the determined time delay.

Also, in some embodiments, the controller 131 can include a contact verification module 327 configured to record an actual azimuthal position of the notch alignment feature 117 relative to the fixed reference ray 115 at a precise instance when the substrate holder 101 reaches the prescribed vertical position 203. In some embodiments, the contact verification module 327 is configured to determine an azimuthal difference between the actual azimuthal position of the notch alignment feature 117 relative to the fixed reference ray 115 (at the precise instance when the substrate holder 101 reaches the prescribed vertical position 203) and the prescribed azimuthal position of the notch alignment feature 117 relative to the fixed reference ray 115. And, in some embodiments, the contact verification module 327 is configured to determine an adjustment to the time delay (as determined by the approach initiation control module 321) based on the determined azimuthal difference in order to reduce an absolute value of the azimuthal difference to an acceptable level. In some embodiments, the acceptable level of the absolute value of the azimuthal difference is up to about 5 degrees. And, in some embodiments, the controller 131 is configured to apply the determined adjustment to the time delay for initiating vertical movement of the substrate holder 101 in a subsequent substrate processing event.

In some embodiments, the controller 131 is configured to receive a specified substrate entry profile as an input along with the substrate entry start position 204 data and determine the entry process time that will elapse from the initial vertical movement of the substrate holder 101 away from the substrate entry start position 204 until the substrate holder 101 reaches the prescribed vertical position 203 at which the substrate 103 first contacts the electroplating solution 111. Then, based on this entry process time and tracking of the substrate holder 101 movement during the entry process, the controller 131 determines where the notch alignment feature 117 will be located relative to the fixed reference ray 115 when the substrate holder 101 reaches the prescribed vertical position 203. Then, the controller 131 determines a time delay required before initiating vertical movement of the substrate holder 101 away from the substrate entry start position 204 toward the prescribed vertical position 203 in order to have the notch alignment feature 117 located at a prescribed location relative to the fixed reference ray 115 when the substrate 103 first contacts the electroplating solution 111. In some embodiments, the time delay can be up to 2 seconds. However, it should be understood that the time delay can be essentially any amount time as needed based on the entry profile characteristics.

In some embodiments, the entry profile that is pre-determined as part of the electroplating recipe does not get changed during the substrate 103 entry process into the electroplating solution 111. Rather, the determined time delay is applied at the substrate entry start position 204 after a move-to-plate command is issued, so that movement of the substrate holder 101 in accordance with the pre-determined entry profile will cause the notch alignment feature 117 to be at the prescribed location relative to the fixed reference ray 115 when the substrate 103 first contacts the electroplating solution 111. In other words, with a pre-programmed entry profile, it is possible to determine where the notch alignment feature 117 should be positioned relative to the fixed reference ray 115 when vertical movement of the substrate holder 101 toward the electroplating solution 111 is initiated, so that the notch alignment feature 117 will be located at the prescribed location relative to the fixed reference ray 115 when the substrate 103 first contacts the electroplating solution 111. And, because the notch alignment feature 117 location is tracked by the controller 131 from the initial loading of the substrate 103 on the substrate holder 101, the controller 131 is able to determine the required time delay in order to have the notch alignment feature 117 at the prescribed location relative to the fixed reference ray 115 when vertical movement of the substrate holder 101 toward the electroplating solution 111 is initiated.

It should be understood that the principles described herein for controlling the entry of the substrate 103 into the bath of the electroplating solution 111 can be generalized to any application beyond the electroplating application. In a generalized embodiment, the substrate holder is to be moved linearly in a direction normal to a target plane, where the target plane can have any spatial orientation, e.g., horizontal, vertical, off-level, etc. In this generalized embodiment, the rotational axis 105 of the substrate holder 101 is oriented normal to the target plane. Also, in this generalized embodiment, tilting of the substrate holder 101 at the prescribed angular position 112 is done relative to a reference plane that is parallel to the target plane. Also, in this generalized embodiment, the prescribed vertical position 203 relative to the target horizontal plane 113, as described with regard to the vertical (z-direction) movement embodiment, becomes a prescribed normal position relative to the target plane, i.e., a prescribed position on a vector normal to the target plane along which the substrate holder 101 moves toward the target plane.

Figure 4:
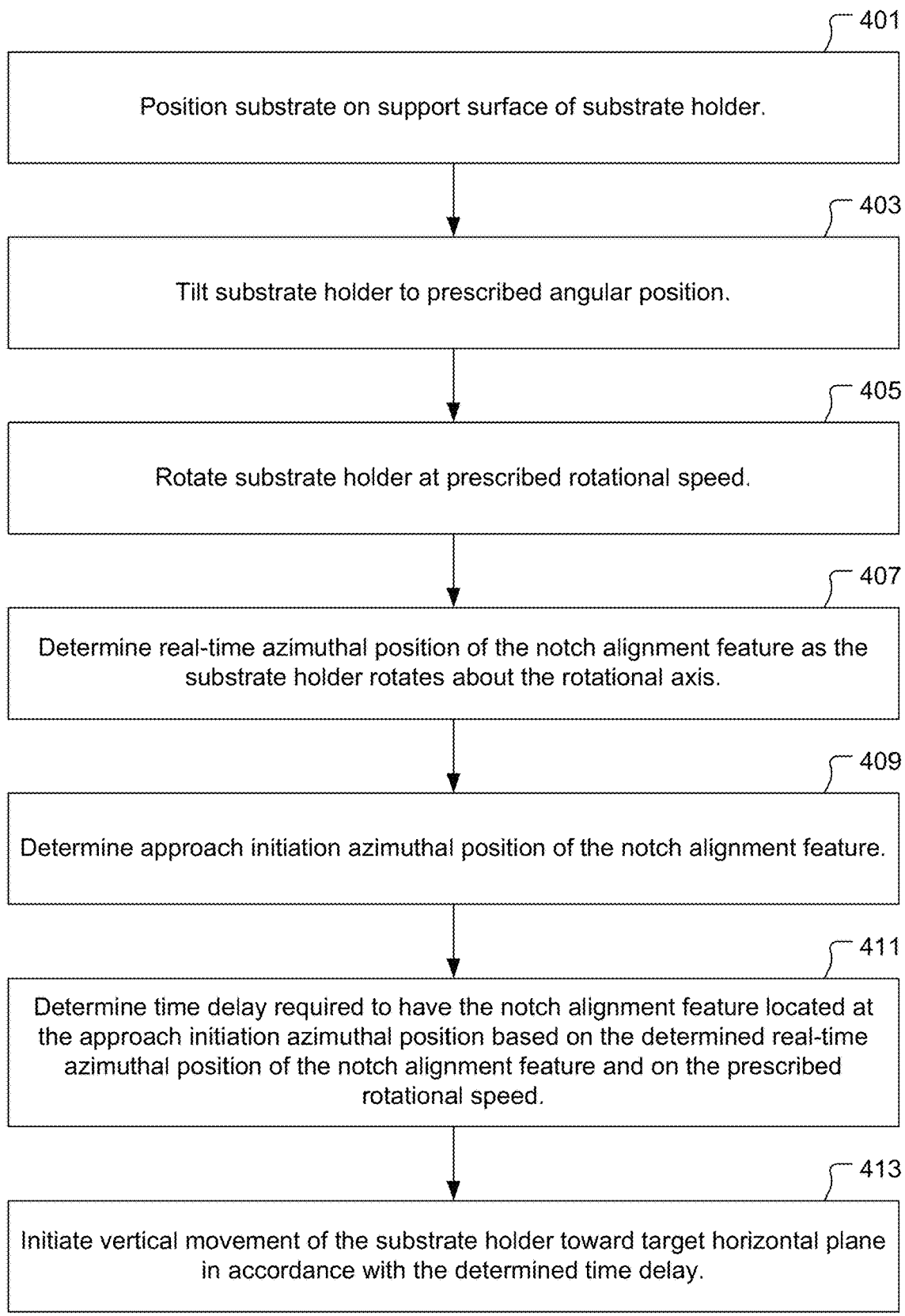
FIG. 4 shows a flowchart of a method for controlling an approach of a substrate toward a target horizontal plane, in accordance with some embodiments of the present invention.

FIG. 4 shows a flowchart of a method for controlling an approach of a substrate (103) toward a target horizontal plane (113), in accordance with some embodiments of the present invention. The method includes an operation 401 for positioning a substrate (103) on a support surface of a substrate holder (101) configured to securely hold the substrate (103). The substrate holder (101) has a notch alignment feature (117) located at a periphery of the support surface of the substrate holder (101). The substrate holder (101) is configured to rotate about a rotational axis (105) extending through a centerpoint of the support surface of the substrate holder (101). The rotational axis (105) is oriented normal to the support surface of the substrate holder (101). The substrate holder (101) is configured to tilt relative to a horizontal reference plane (110). The substrate holder (101) is configured to move vertically relative to the target horizontal plane (113). The method also includes an operation 403 for tilting the substrate holder (101) to a prescribed angular position (112) of the support surface relative to the horizontal reference plane (110). The method also includes an operation 405 for rotating the substrate holder (101) about the rotational axis (105) at a prescribed rotational speed.

The method also includes an operation 407 for determining a real-time azimuthal position of the notch alignment feature (117) as the substrate holder (101) rotates about the rotational axis (105), where the real-time azimuthal position of the notch alignment feature (117) is determined relative to a fixed reference ray (115) extending perpendicularly away from the rotational axis (105). The method also includes an operation 409 for determining an approach initiation azimuthal position of the notch alignment feature (117) relative to the fixed reference ray (115) at which vertical movement of the substrate holder (101) should initiate in order to have the notch alignment feature (117) located at a prescribed azimuthal position relative to the fixed reference ray (115) when the substrate holder (101) reaches a prescribed vertical position (203) relative to the target horizontal plane (113). In some embodiments, determining the approach initiation azimuthal position of the notch alignment feature (117) relative to the fixed reference ray (115) includes processing an entry profile that includes a rotational movement specification for the substrate holder (101) and a vertical movement specification for the substrate holder (101) to be implemented from initiation of vertical movement of the substrate holder (101) until the substrate holder (101) reaches the prescribed vertical position (203) relative to the target horizontal plane (113).

The method also includes an operation 411 for determining a time delay required to have the notch alignment feature (117) located at the approach initiation azimuthal position based on the determined real-time azimuthal position of the notch alignment feature (117) and on the prescribed rotational speed.

In some embodiments, determining the time delay required to have the notch alignment feature (117) located at the approach initiation azimuthal position and initiating vertical movement of the substrate holder (101) toward the target horizontal plane (113) in accordance with the determined time delay is performed through a combination of hardware and firmware to avoid imprecision in initiating vertical movement of the substrate holder (101) toward the target horizontal plane (113) due to signal communication delay. The method also includes an operation 413 for initiating vertical movement of the substrate holder (101) toward the target horizontal plane (113) in accordance with the determined time delay. In some embodiments, the method can also include an operation for recording an actual azimuthal position of the notch alignment feature (117) relative to the fixed reference ray (115) at a precise instance when the substrate holder (101) reaches the prescribed vertical position (203) relative to the target horizontal plane (113).

In some embodiments of the method of FIG. 4, the target horizontal plane (113) corresponds to a top surface of a bath of an electroplating solution (111) located below the substrate holder (101), and the support surface of the substrate holder (101) is a lower surface of the substrate holder (101), and the vertical movement of the substrate holder (101) toward the target horizontal plane (113) is a downward movement of the substrate holder (101). However, it should be understood that the method of FIG. 4 is not limited to an electroplating process. For example, the method of FIG. 4 can be applied equally to a generalized embodiment in which the substrate holder (101) is to be moved linearly in a direction normal to a target plane, where the target plane can have any spatial orientation, e.g., horizontal, vertical, off-level, etc. In this generalized embodiment, the rotational axis (105) of the substrate holder (101) is oriented normal to the target plane. Also, in this generalized embodiment, the substrate holder (101) is tilted to a prescribed angular position (112) relative to a reference plane that is parallel to the target plane. Also, in this generalized embodiment, the prescribed vertical position (203) relative to the target horizontal plane (113) becomes a prescribed normal position relative to the target plane.

Figure 5A:
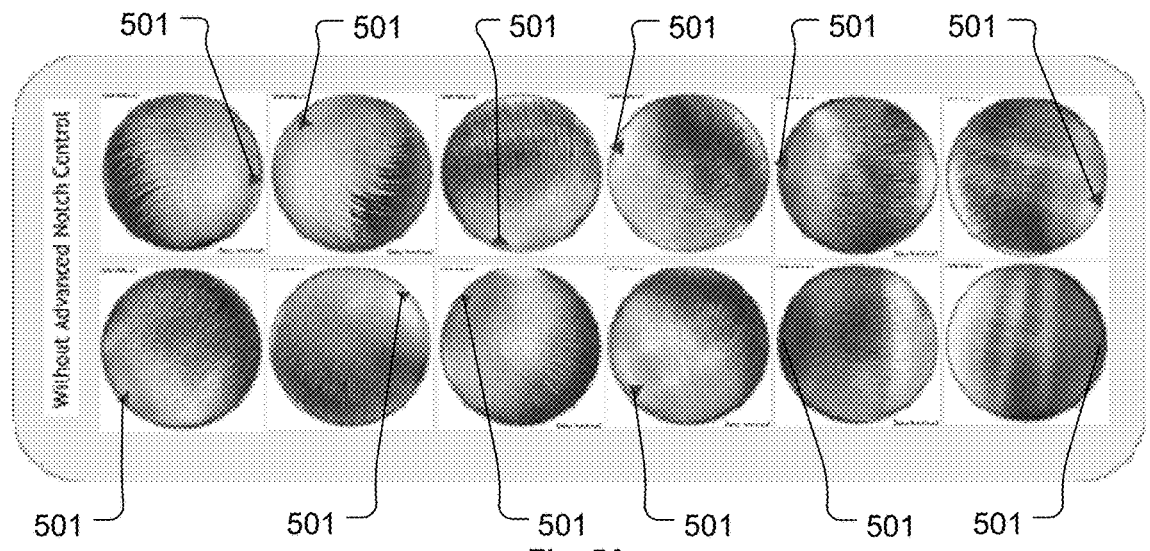
FIG. 5A shows a number of substrate metrology haze maps demonstrating a lack of control of the notch alignment feature when the substrate first contacts the electroplating solution that can occur without the Advanced Notch Control systems and methods disclosed herein.

FIG. 5A shows a number of substrate metrology haze maps demonstrating a lack of control of the notch alignment feature 117 position relative to the fixed reference ray 115 when the substrate 103 first contacts the electroplating solution 111 that can occur without the Advanced Notch Control systems and methods disclosed herein. FIG. 5A shows a location 501 on each substrate that first contacts the electroplating solution 111. The substrate-to-substrate variability with regard to the location on the substrate that first contacts the electroplating solution 111 can be attributed to substrate holder 101 vertical movement and/or rotational movement timing differences between electroplating processes performed on different substrates.

Figure 5B:
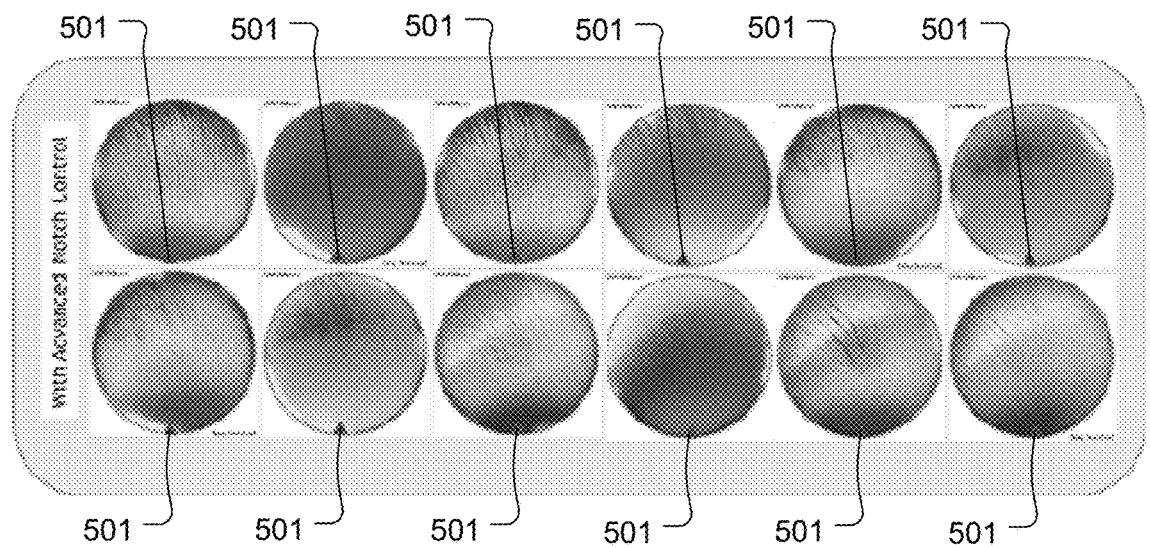
FIG. 5B shows a number of substrate metrology haze maps demonstrating how the Advanced Notch Control systems and methods disclosed herein provide for control of the notch alignment feature position relative to the fixed reference ray when the substrate first contacts the electroplating solution, in accordance with some embodiments of the present invention.

FIG. 5B shows a number of substrate metrology haze maps demonstrating how the Advanced Notch Control systems and methods disclosed herein provide for control of the notch alignment feature 117 position relative to the fixed reference ray 115 when the substrate 103 first contacts the electroplating solution 111, in accordance with some embodiments of the present invention. FIG. 5B demonstrates that the Advanced Notch Control systems and methods disclosed herein provide for effective monitoring and control of the notch alignment feature 117 position relative to the fixed reference ray 115 to enable repeatability of the location of the notch alignment feature 117 position relative to the fixed reference ray 115 when the substrate 103 first contacts the electroplating solution 111 in different electroplating processes performed on different substrates, which can facilitate defect troubleshooting.

Figure 6:
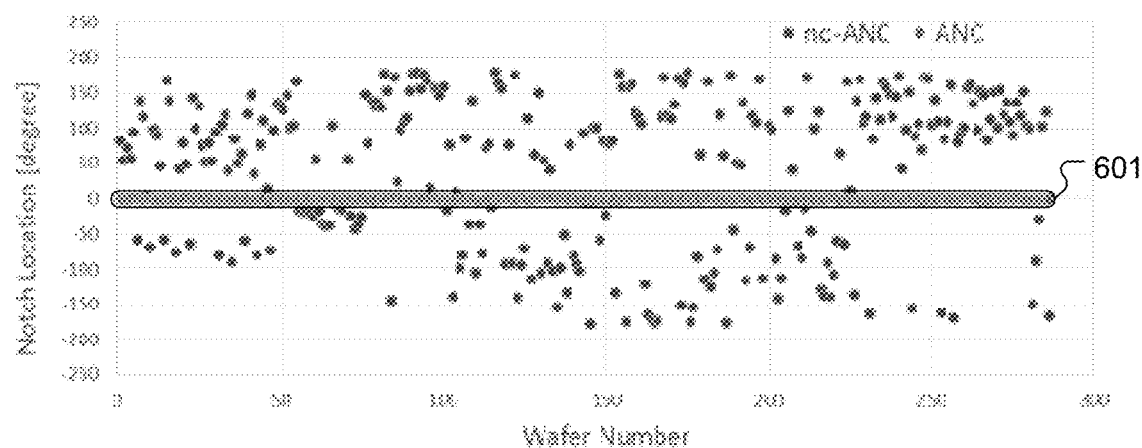
FIG. 6 shows a comparison of the notch alignment feature locations during substrate entry for a set of substrates run with different entry conditions both with and without the Advanced Notch Control systems and methods disclosed herein.

FIG. 6 shows a comparison of the notch alignment feature 117 locations during substrate entry for a set of substrates run with different entry conditions both with and without the Advanced Notch Control systems and methods disclosed herein. Without the Advanced Notch Control, the notch alignment feature 117 locations can vary randomly within a range from −180° to +180° relative to the fixed reference ray 115. With the Advanced Notch Control, the notch alignment feature 117 locations can be controlled within a 5° range about the prescribed position of the notch alignment feature 117 relative to the fixed reference ray 115, as indicated by the tightly grouped cluster of data points 601. In some embodiments, the Advanced Notch Control systems and method described herein can control the position of the notch alignment feature 117 relative to the fixed reference ray 115 at the instance when the substrate 103 first contacts the electroplating solution 111 within an azimuthal range of up to +/−5°, regardless of entry profile and electroplating system setup.

The Advanced Notch Control systems and methods described herein include advancements in the controller 131 hardware and firmware, and in the controller 131 software program to enable integrated control of the substrate holder 101 vertical movement, rotational movement, and tilt movement. It should be appreciated that by controlling the vertical, rotational, and tilt movements of the substrate holder 101 through a single master controller 131 during entry of the substrate 103 into the electroplating solution 111, these different movements of the substrate holder 101 can be synchronized and executed with very precise timing to provide control over the location on the substrate 103 that first contacts the electroplating solution 111. Also, the Advanced Notch Control systems and methods disclosed herein provide for implementation of specially coordinated vertical, rotational, and tilt movements of the substrate holder 101 during entry of the substrate 103 into the electroplating solution 111, which can result in electroplating process improvement and device yield improvement. With vertical, rotational, and tilt movements of the substrate holder 101 under the control of a single master controller 131, it is possible to plan entry movement of the substrate 103 into the electroplating solution 111 and prescribe a notch alignment feature 117 azimuthal position relative to the location on the substrate 103 that first contacts the electroplating solution 111 in accordance with a user-defined program and/or process recipe.

In some embodiments, the firmware in the controller 131 is configured to perform substrate holder 101 vertical movement entry profile computations through point tables in the firmware for both trapezoidal and complex function entry movements. A trapezoidal entry point table can be designed to account for variability in the substrate holder 101 vertical acceleration, substrate holder 101 vertical deceleration, substrate 103 entry liquid touch point, and substrate holder 101 position. With the substrate holder 101 vertical movement profiles implemented as part of the firmware, it is possible to pre-calculate the substrate holder 101 vertical movement timings based on the specific substrate holder 101 vertical movement profile requested through the process recipe. The controller 131 firmware enables real-time tracking of the notch alignment feature 117 location and uses that to predict the notch alignment feature 117 location at any given vertical position of the substrate holder 101 based on any substrate holder 101 vertical movement profile and rotational velocity specified within the process recipe.

As discussed above, in the absence of the Advanced Notch Control systems and method disclosed herein, execution of the electroplating process prior to entry of the substrate 103 into the electroplating solution 111 can include some signal communication delays that cause variability in the notch alignment feature 117 position relative to the location on the substrate 103 that first contacts the electroplating solution 111. However, with the Advanced Notch Control systems and methods, the controller 131 is able to track the notch alignment feature 117 position in real-time up to the very last move-to-plate command that initiates vertical movement of the substrate holder 101 toward the bath of the electroplating solution 111. Prior to the move-to-plate command, the controller 131 tracks the notch alignment feature 117 location, pre-calculates the substrate holder 101 vertical movement timings, and predicts the final notch alignment feature 117 position when the substrate 103 first contacts the electroplating solution 111. Also, in some embodiments, the location on the substrate 103 that is to first contact the electroplating solution 111 can be specified as an input through control system software in communication with the controller 131.

In some embodiments, it may be desired to have the same location on the substrate 103 first contact the electroplating solution 111 for each substrate in a lot of multiple substrates. The Advanced Notch Control systems and methods disclosed herein provide for dynamic computation of the time delay needed have the notch alignment feature 117 at the prescribed location relative to the fixed reference ray 115 when the substrate 103 first contacts the electroplating solution 111 as specified in the electroplating process recipe. The controller 131 performs the timing computations in real-time for accurate and repeatable control of the notch alignment feature 117 location at the moment the substrate 103 first contacts the electroplating solution 111 based on the existing rotational velocity of the substrate holder 101 and the substrate holder 101 vertical movement specification within the electroplating recipe. Also, because the timing computations are performed rapidly by firmware within the controller 131, substrate processing throughput is enhanced.

In some embodiments, a substrate electroplating process entry profile is defined by a set of 3 to 50 lift point tables. Each of the points in the lift point table includes the substrate holder 101 vertical position (defined relative to the prescribed substrate holder vertical position 203 at which the substrate 103 first contacts the electroplating solution 111), along with substrate holder 101 vertical movement velocity, acceleration, and deceleration values at the substrate holder 101 vertical position. An example substrate electroplating process entry profile having 25 points will be defined by 100 parameter values, corresponding to substrate holder 101 vertical movement velocity, acceleration, and deceleration values at each substrate holder 101 vertical position.

Since each electroplating process recipe can have a different entry profile, in some embodiments, the controller 131 calculates the entry profiles each time a substrate electroplating process is performed, which requires some time overhead than may impact throughput. In some embodiments, the substrate electroplating process entry profiles can be optimized and tailored for specific technology nodes for yield enhancements. However, once the entry profile is optimized, in high-volume manufacturing the same entry profile can be run for many substrate lots. In some embodiments, the controller 131 provides for dynamic comparison of a current electroplating process recipe with electroplating process recipes that have been previously performed. And, if the dynamic comparison shows a match between the current electroplating process recipe and a previously executed electroplating process recipe, the controller 131 can use the entry profile previously computed for the previously executed electroplating process recipe, thereby reducing the time overhead needed for computation of the entry profile, which results in faster execution of the move-to-plate command and improved throughput.

In some embodiments, electroplating process throughput can be enhanced by improvement in the time delay control for initiating vertical movement of the substrate holder 101 toward the electroplating solution 111. As discussed herein, the time delay prior to initiating vertical movement of the substrate holder 101 toward the electroplating solution 111 is integral to controlling the notch alignment feature 117 location at the instance when the substrate 103 first contacts the electroplating solution 111. Since the time delay computation is performed dynamically with the controller 131, there may be some timing overhead delay in initiating vertical movement of the substrate holder 101 toward the electroplating solution 111, which can result in some inaccuracy in notch alignment feature 117 location at the instance when the substrate 103 first contacts the electroplating solution 111. In some embodiments, to address this issue, an adjustment can be made to the timing delay for initiating vertical movement of the substrate holder 101 to account for the controller 131 computational time overhead. However, in some cases, this adjustment to the timing delay for initiating vertical movement of the substrate holder 101 may affect throughput.

In some embodiments, to compensate for the controller 131 computation time overhead, a threshold-based rotation trigger check is enabled that dynamically determines an azimuthal offset of the notch alignment feature 117 with respect to the required notch alignment feature 117 location at which vertical movement of the substrate holder 101 is to be initiated, and increases the substrate holder 101 rotational velocity when the determined azimuthal offset of the notch alignment feature 117 is less than a set azimuthal offset threshold value. It should be appreciated that increasing the substrate holder 101 rotational velocity to compensate for the controller 131 computation time overhead does not require an increase in the timing delay for initiating vertical movement of the substrate holder 101 to account for the azimuthal offset. Also, it should be appreciated that increasing the substrate holder 101 rotational velocity to compensate for the controller 131 computation time overhead is only done when the azimuthal offset indicates that there is a possibility of an unacceptable amount of overshoot of the prescribed notch alignment feature 117 location at the instance when the substrate 103 first contacts the electroplating solution 111. Over the course of many electroplating processes, the threshold-based rotation trigger check can reduce an overall timing delay for initiating vertical movement of the substrate holder 101 toward the electroplating solution 111 as part of implementing the Advanced Notch Control systems and methods.

With the Advanced Notch Control systems and methods disclosed herein many other substrate entry process enhancements can be enabled, including coordination of rotation and vertical movement profiles during substrate entry for process improvement, use of advanced rotation profiles such as reverse rotation triggered by entry, back-and-forth motion with coordinated vertical motion, and rotation velocity change triggered by entry, among others. These substrate entry process enhancements afforded by the Advanced Notch Control systems and methods disclosed herein have been shown to provide electroplating process improvements. Additionally, it should be understood that the Advanced Notch Control systems and methods disclosed herein are not limited to use in electroplating processes, but can be implemented on any tool that requires controlling movement of a substrate with regard to multiple axes of motion, e.g., tilt, rotation, linear movement.

It should be understood that without the Advanced Notch Control systems and methods disclosed herein, an electroplating system having two separate master controllers for substrate holder 101 vertical movement and substrate holder 101 rotation, respectively, would require an additional communication layer established between the separate master controllers to attempt the notch alignment feature 117 position control as provided by the Advanced Notch Control systems and methods disclosed herein. An electroplating system implementing the additional communication layer to establish direct communication between the separate master controllers for substrate holder 101 vertical movement and substrate holder 101 rotation would be less accurate and more expensive than the electroplating system implementing the Advanced Notch Control systems and methods as disclosed herein. Or, without the Advanced Notch Control systems and methods disclosed herein, an electroplating system having two separate master controllers for substrate holder 101 vertical movement and substrate holder 101 rotation, respectively, would have to manage the coordination between the vertical movement and rotation control systems, which would be least accurate. Also, with this least accurate electroplating system configuration, characterization of the notch alignment feature 117 position at the instance the substrate 103 first contacts the electroplating solution 111 would have to be determined empirically. This means for every type of substrate entry profile and electroplating system hardware setup, it would be necessary to execute repeated substrate entry movements in order to "teach" the control system, which would required tool downtime and increase costs.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for controlling an approach of a substrate toward a target horizontal plane, comprising:
    rotating a substrate about a rotational axis, the rotational axis positioned at a non-zero angle relative to a vertical direction, the substrate positioned vertically above a target horizontal plane, the substrate having a notch alignment feature located at an outer peripheral edge of the substrate; and
    controlling downward vertical movement of the substrate toward the target horizontal plane as the substrate continues to rotate about the rotational axis positioned at the non-zero angle relative to the vertical direction, the downward vertical movement of the substrate controlled such that the notch alignment feature of the substrate is at a prescribed azimuthal position about the rotational axis when any portion of the substrate first reaches the target horizontal plane.

2. The method as recited in claim 1, wherein the rotational axis extends perpendicularly through a centerpoint of the substrate.

3. The method as recited in claim 1, wherein the substrate is rotated about the rotational axis at a prescribed substantially constant rotational speed.

4. The method as recited in claim 3, further comprising:
    determining a real-time azimuthal position of the notch alignment feature about the rotational axis relative to a fixed reference ray; and
    determining an entry profile for controlling the downward vertical movement of the substrate to the target horizontal plane.

5. The method as recited in claim 4, wherein the entry profile includes a prescribed downward acceleration of the substrate, and a prescribed downward maximum velocity of the substrate, and a time delay for initiating downward vertical movement of the substrate.

6. The method as recited in claim 5, wherein the time delay is based in part on the real-time azimuthal position of the notch alignment feature about the rotational axis relative to the fixed reference ray.

7. The method as recited in claim 6, further comprising:
    detecting and verifying a real-time vertical position of the substrate relative to the target horizontal plane.

8. The method as recited in claim 7, further comprising:
    detecting and verifying a real-time angle of the rotational axis relative to the vertical direction.

9. The method as recited in claim 1, further comprising:
    determining a real-time rotational speed of the substrate about the rotational axis;
    determining a real-time azimuthal position of the notch alignment feature about the rotational axis relative to a fixed reference ray; and
    determining an entry profile for controlling the downward vertical movement of the substrate to the target horizontal plane.

10. The method as recited in claim 9, wherein the entry profile includes a prescribed rotational speed of the substrate about the rotational axis, a prescribed downward acceleration of the substrate, and a prescribed downward maximum velocity of the substrate, and a time delay for initiating downward vertical movement of the substrate.

11. The method as recited in claim 10, wherein the time delay is based in part on the rotational speed of the substrate about the rotational axis, the real-time azimuthal position of the notch alignment feature about the rotational axis relative to the fixed reference ray, and a closest distance between the substrate and the target horizontal plane.

12. The method as recited in claim 11, further comprising:
    detecting and verifying a real-time vertical position of the substrate relative to the target horizontal plane.

13. The method as recited in claim 12, further comprising:
    detecting and verifying a real-time angle of the rotational axis relative to the vertical direction.

14. The method as recited in claim 1, wherein the target horizontal plane corresponds to a top surface of a bath of an electroplating solution located below the substrate.

15. The method as recited in claim 1, further comprising:
    securing the substrate in a face-down orientation to a bottom surface of a substrate holder, the substrate holder having a top surface connected to a shaft centered about the rotational axis, the shaft connected for controlled rotation about the rotational axis, the shaft connected for controlled tilting of the shaft relative to the vertical direction, the shaft connected for controlled vertical movement of the shaft.

16. The method as recited in claim 1, further comprising:
    determining an actual azimuthal position of the notch alignment feature about the rotational axis when any portion of the substrate first reaches the target horizontal plane;
    determining an azimuthal difference between the actual azimuthal position of the notch alignment feature about the rotational axis and the prescribed azimuthal position of the notch alignment feature about the rotational axis; and
    determining an adjustment of an entry profile for controlling the downward vertical movement of the substrate to the target horizontal plane that will reduce an absolute value of the azimuthal difference to less than or equal to a set value.

17. The method as recited in claim 16, wherein the adjustment of the entry profile includes an adjustment to one or more of a prescribed rotational speed of the substrate about the rotational axis, a prescribed downward acceleration of the substrate, and a prescribed downward maximum velocity of the substrate, and a time delay for initiating downward vertical movement of the substrate.

18. The method as recited in claim 16, wherein the adjustment of the entry profile includes an adjustment to a time delay for initiating downward vertical movement of the substrate.

19. The method as recited in claim 16, wherein the set value is five degrees.

20. The method as recited in claim 16, wherein determining the adjustment of the entry profile and implementing the adjustment of the entry profile is done automatically through firmware in a controller.

* * * * *